United States Patent [19]
Alvis et al.

[11] Patent Number: 4,837,173
[45] Date of Patent: Jun. 6, 1989

[54] N-CHANNEL MOS TRANSISTORS HAVING SOURCE/DRAIN REGIONS WITH GERMANIUM

[75] Inventors: John R. Alvis; James R. Pfiester, both of Austin, Tex.; Orin W. Holland, Oak Ridge, Tenn.

[73] Assignee: Motorola, Inc., Schaumburg, Ill.

[21] Appl. No.: 72,932

[22] Filed: Jul. 13, 1987

[51] Int. Cl.4 .......................................... H01L 21/265
[52] U.S. Cl. ................................... 437/024; 437/027; 437/044
[58] Field of Search ..................... 437/24, 27, 44, 29

[56] References Cited

U.S. PATENT DOCUMENTS

| 4,111,719 | 9/1978 | Mader et al. | 437/27 |
| 4,318,216 | 3/1982 | Hsu | 437/44 |
| 4,332,627 | 6/1982 | Schmitt et al. | 437/30 |
| 4,603,471 | 8/1986 | Strain | 437/24 |
| 4,617,066 | 10/1986 | Vasudev | 437/19 |

FOREIGN PATENT DOCUMENTS 0258447 11/1986 Japan .................................... 437/44

OTHER PUBLICATIONS

"Bipolar Transistors with a High Mobility Base", *Research Disclosure*, (Nov. 1987), p. 28375.

*Primary Examiner*—Olik Chaudhuri
*Attorney, Agent, or Firm*—John A. Fisher

[57] ABSTRACT

Metal-oxide-semiconductor (MOS) transistors with n-type source/drain regions also having germanium-doped regions in or near the source/drains. The presence of germanium near or at the location of phosphorus in graded source drains (GSDs), lightly doped drains (LDDs) and double diffused drains (DDDs) gives a better profile of the drain region with a reduced junction depth than that obtainable with phosphorus or particularly phosphorus and arsenic together. Good grading of the drain junction to avoid hot carrier instability or hot carrier injection problems is obtained along with shallow source junctions, which minimizes lateral dopant diffusion and decreases the distance between n− and n+ regions in GSDs and LDDs.

9 Claims, 10 Drawing Sheets

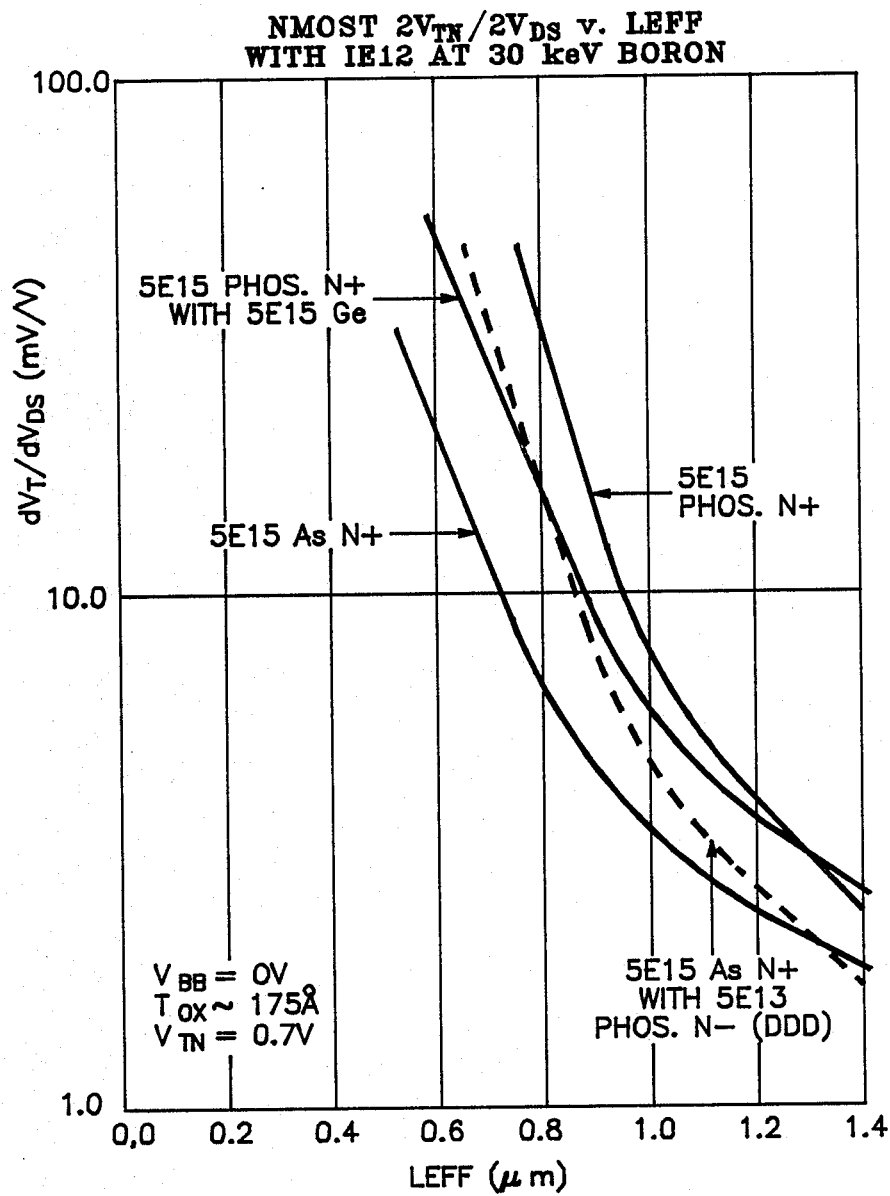
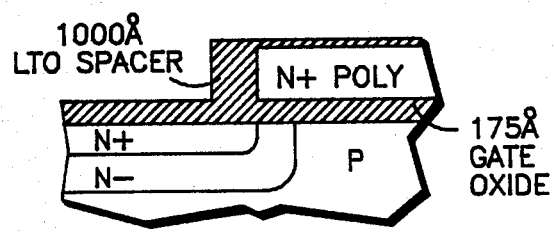
*FIG.11*

N-CHANNEL MOS TRANSISTORS HAVING SOURCE/DRAIN REGIONS WITH GERMANIUM

FIELD OF THE INVENTION

The invention relates to the fabrication of metal-oxide-semiconductor (MOS) transistors, and more particularly relates to the fabrication of MOS transistors having source/drain regions with shallow junction depths.

BACKGROUND OF THE INVENTION

In the formation of fine-line MOS devices, a recurring and severe problem as the devices become smaller is hot carrier instability (HCI). This problem is related to the shorter channels of the smaller devices, such as when the channel length is 1 micron (um) or smaller, and occurs due to high electrical fields between the source and the drain, particularly near the drain that cause carriers, either electrons or holes, to be injected into the gate or substrate. The injection of hot carriers into the gate can cause gate oxide charging and threshold voltage instabilities which accumulate over time and greatly degrade device performance. Thus, HCI may also stand for hot carrier injection.

The effect of the high-charge levels in the thin gate dielectric is to shift the MOST field effect transistor (FET) device threshold, which makes it difficult or impossible for the FET device to operate correctly. HCI into gate insulators is a universal problem for small geometry FETs (channel lengths less than or equal to 1 um), since most hot carriers are trapped within approximately 100 Angstroms of the semiconductor surface.

This problem has been addressed by attempting to reduce the strength of the electric field near the source and the drain regions. One approach concerns using a graded drain structure, or graded source/drain (GSD). For instance, in an n-channel device, a heavily doped drain of phosphorus or arsenic surrounded by a lighter doping of phosphorus is used to gradually extend the drain region into the channel region to reduce the electric field strength right at the drain. However, this approach can be undesirable in that it causes larger overlap capacitance with the gate, larger lateral diffusion and channel shortening. Typically, merely the deeper junction of the drain produces more disadvantageous short channel effects, such as an abrupt dropoff of threshold voltage with $L_{eff}$.

Further, the drain is preferred to be shallow and laterally graded as to profile as well as concentration. That is, it is desired for the drain profile to have a gradual decrease in surface concentration from the n+ regions 22 and 24 to the channel region 11, as depicted in the n-channel MOS field effect transistor (FET) 20 of FIG. 1. Less desirable is the profile shape shown in FIG. 2, where the source/drain regions exhibit similar lateral grading but with deeper vertical junctions. With deeper junctions, there is a wider subsurface depletion effect and it is easier for the field lines to go from the drain to the source, which causes "punch through current" problems and shorts out the device.

A known alternative to the graded source/drain structure is the use of lightly doped drains (LDDs). LDDs consist of a lightly doped source/drain region that is driven just under the gate region, while the heavily doped drain region is laterally displaced away from the gate by use of a sidewall spacer on the gate. LDDs are advantageous because they do not have problems with excess lateral or vertical impurity diffusion. However, the process for making LDDs is complex, and typically requires the formation of a sidewall spacer n the gate to provide the exact horizontal and/or lateral displacement of the lightly and heavily doped drain sections. That is, in LDDs, the n− portion of the source/drain region is aligned to the polysilicon gate edge, and the n+ portion of the source/drain region is aligned to a spacer edge.

Another alternative to these structures is a double diffused drain (DDD). This feature is similar to the graded source drain discussed above, except that in this case, arsenic and phosphorus are implanted together, or are introduced into the same area, and are diffused together to form the source/drain structure. That is, both the n− and n+ portions of the source/drain regions are aligned to the polysilicon gate edge. The process for making DDDs is very simple compared to that for making graded source/drains or LDDs in that the impurity introduction is performed essentially all at one time and the anneal for both phosphorus and arsenic is performed together. However, the disadvantage with the DDD structure is that due to cooperative diffusion effects, phosphorus tends to diffuse faster in the presence of high arsenic doping, even faster than phosphorus diffuses by itself. Thus, the typical DDD structure tends to appear like that shown in FIG. 2; the LDD tends to appear like that shown in FIG. 1. This undesirable effect that enhances the phosphorus diffusion discourages the use of arsenic and phosphorus together in a DDD, and phosphorus alone or GSDs and LDDs are used instead.

Shown in FIG. 2 is a prior art MOSFET 10 on a semiconductor substrate 12, such as silicon, covered by a thin gate dielectric material 14. Upon the thin gate dielectric material 14 is a patterned gate material 15, covered by thermal oxide layer 13, having opposing sides adjacent which are source/drain regions 16 through 19. It will be appreciated that the source/drain regions 16 and 18, and especially n− source/drain regions 17 and 19, are deeper than desired due to the accelerated phosphorus diffusion in the presence of arsenic, and thus these DDDs suffer from the same disadvantages as the graded source/drains with deep junctions discussed above.

It would be desirable if the MOSFET 10 would have source/drain regions with a profile more like the profiles shown by n+ source/drain regions 22 and 24 and n− source/drain regions 23 and 25 in an improved MOSFET 20 illustrated in FIG. 1. Here, the source/drain regions 22 through 25 have the desired profile, satisfactory lateral grading with shallow vertical junction depths. The edges of the source/drain regions also have sufficient concentration just beneath the gate. In the DDD structure of FIG. 2, the n-type impurity regions 17 and 19 are deeper into the silicon 12 region. It will be appreciated that in the structure of FIG. 1, the primary impurity concentration remains at the surface of the semiconductor substrate. It would thus be advantageous if a process could be devised which would produce source/drain regions that would help solve HCI effects, but also be less susceptible to unwanted diffusion, as well as be easy to manufacture.

SUMMARY OF THE INVENTION

Accordingly, it is an object of the present invention to provide a process for forming source/drain regions in MOS transistors integrated circuits where the transistors do not suffer severely from HCI effects.

It is another object of the present invention to provide a HCI-resistant MOS transistor that is less susceptible to unwanted diffusion of the source/drain dopants with subsequent thermal process steps.

Still another object of the present invention is to provide a MOS transistor resistant to HCI effects, which can be fabricated relatively easily using relatively few process steps.

Yet another object of the invention is to provide a technique for selecting MOSFETS on an integrated circuit to have their characteristics easily modified with a selective germanium implant, or even one of the source/drain regions of a particular MOSFET modified with germanium, such as in bootstrap circuits or static random access memory (SRAM) sense amplifiers.

In carrying out these and other objects of the invention, there is provided, in one form, a process for retarding the diffusion of phosphorus to a greater extent vertically into the surface of a semiconductor substrate relative to the diffusion of phosphorus laterally. The process involves first providing a semiconductor substrate having a surface, and then implanting germanium ions an n-type dopant ions into the surface of the semiconductor substrate. The n-type dopant ions may be arsenic or phosphorus and may be implanted before and after the germanium is in place. It is important that the germanium in the semiconductor material be at or near the phosphorus in the semiconductor material to achieve the enhanced profile effects. Optionally, a spacer may be formed before the n+ (arsenic or phosphorus) source/drain implant to form an LDD-type structure. Finally, the semiconductor substrate is annealed.

BRIEF DESCRIPTION OF THE DRAWINGS

FIG. 11 is a plot of the change in n-channel threshold voltage with respect to the change in drain bias, $dV_{TN}/dV_{DS}$, v. $L_{eff}$ for particular n-channel MOS transistors of a particular doping makeup.

DETAILED DESCRIPTION OF THE INVENTION

Figure 1:
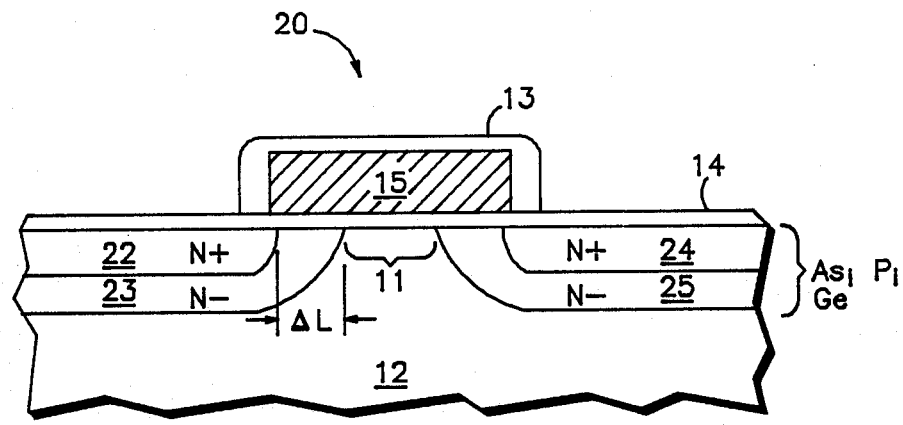
FIG. 1 is a schematic, cross-sectional illustration of a MOS transistor of this invention with source/drain regions made in accordance with the process of this invention.

Experimental evidence indicates that the implantation of germanium in the source/drain regions of n-channel MOS transistors prior to, during or after the n+ source/drain ion implantation steps results in improved device performance. This finding seems particularly true with respect to arsenic/phosphorus double diffused drains (DDDs).

Part of the improvement can be attributed to the apparent retardation of phosphorus diffusion caused by the influence of locally present germanium. It is known that the presence of germanium with phosphorus creates a preferential zone of diffusion where the phosphorus does not diffuse as fast as it would outside the zone where the effect of the germanium is present. See, for example, V. A. Panteleev, et al., "Influence of Elastic Stresses on Diffusion Processes in Semiconductors," *Sov. Phys. Solid State*, Vol. 19., No. 1, January 1977, pp. 103–105; V. A. Panteleev, et al., "Influence of Elastic Stresses on Diffusion Processes in Semiconductors," *Sov. Phys. Solid State*, Vol. 20, No. 2, February, 1978, pp. 324–325; E. V. Dobrokhotov, et al., "Influence of Dislocation Structures on the Diffusion of Group III–V Elements in Silicon and Germanium," *Sov. Phys. Solid State*, Vol. 18, No. 9, September, 1976, pp. 1640–1641; and R. B. Fair, "Modeling of Dopant Diffusion During Rapid Thermal Annealing," *J. Vac. Sci. Technol.*, Vol. A4, No. 3, May/June, 1986, pp. 926–932.

However, it was surprisingly found that the germanium may annihilate point defects caused by the heavy n+ doped region which may be formed by either an arsenic or phosphorus implantation or chemical predeposition. Thus, phosphorus n− regions with shallow vertical junction depths and acceptable lateral grading results from the use of germanium implantation. Support for this effect may be found in S. Matsumoto, et al., "Effects of Diffusion-Induced Strain and Dislocation on Phosphorus Diffusion into Silicon," *J. Electrochem. Soc.: Solid-State Science and Technology*, Vol. 125, No. 11, November 1978, pp. 1840–1845. However, the present invention has a number of distinctions over the investigations reported in this article. In the Matsumoto article, GeCl$_4$ was used as the germanium species, it was incorporated by diffusion, and no arsenic was employed, in contrast with the present invention, where the germanium species was Ge ion only, ion implantation was used, and proximity to arsenic was found to have a beneficial effect. In fact, the inventors herein have surprisingly discovered that the germanium present with arsenic and phosphorus tends to make both n-dopants give a profile more like that predicted by the SUPREM 3 computer model. Thus, the beneficial presence of the germanium appears linked to allowing the phosphorus and perhaps the arsenic to be more controllable or better behaved within the semiconductor lattice.

Experimental monocrystalline silicon wafer lots were processed to fabricate submicron n-channel MOS transistors. In addition, test wafers received a matrix of phosphorus/arsenic/germanium ion implantation, which were used to determine the vertical concentration profile by SRP measurements. Preliminary results show that a 5E15 atoms/cm$^2$ at 45 keV phosphorus dose with a 5E15 atoms/cm$^2$ at 125 keV germanium ion implant dose allows similar short-channel effects and peak substrate current, $I_{sub}$, as compared with the standard graded drain implants of 5E15 at 70 keV arsenic with 1E14 at 60 keV phosphorus doses. Thus, it is unusual that arsenic may be eliminated from the process for forming acceptable GSDs. Additionally, the use of a 5E15 atoms/cm$^2$ germanium implant with the phosphorus source/drain structure is shown to result in significantly shallower vertical junction depths as compared to the phosphorus only implanted samples. This attribute may be directly determined from the SRPs. The lateral distribution of n-type dopants must be inferred less directly from electrical measurements.

The starting material employed for the experiments was 14–22 ohm-cm p-type monocrystalline silicon wafers. Conventional local oxidation of silicon (LOCOS) techniques were used to grow a 6570 Angstrom thick field oxide which was followed by a 400 Angstrom sacrificial oxide. A 175 Angstrom gate oxide was grown in 3% HCl and O$_2$, and a 500 Angstrom layer of undoped polycrystalline silicon (polysilicon or poly) was subsequently deposited by low pressure chemical vapor deposition (LPCVD). Channel ion implantations were performed, followed by the 3000 Angstrom undoped poly deposition. The polysilicon gates were etched and oxidized to grow a 100 Angstrom silicon oxide layer. A 1250 Angstrom layer of low temperature oxide (LTO) was deposited and subsequently annealed for 1 hour at 830° C. in 1% O$_2$ to minimize the poly gates from lifting during the subsequent source/drain implantation screen oxidation.

Figure 2:
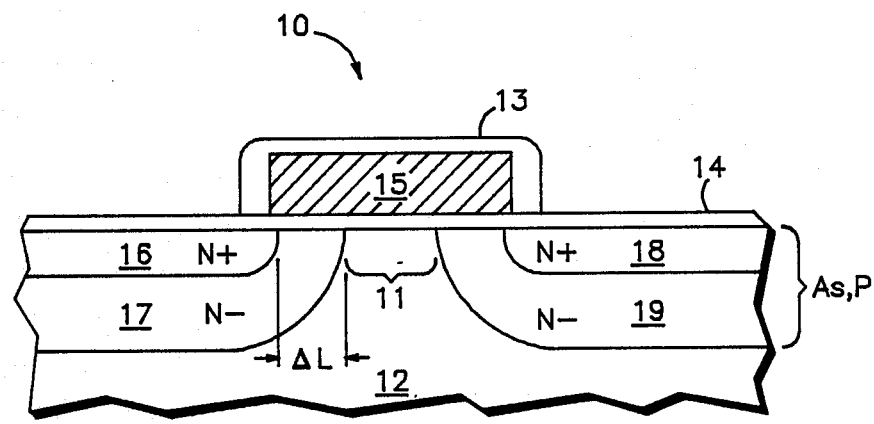
FIG. 2 is a schematic, cross-sectional illustration of a MOS transistor with conventional double-diffused drain regions. It will be appreciated that the illustrations in FIGS. 1 and 2 are not to scale, and have their vertical proportions exaggerated relative to their horizontal proportions for clarity.

The LTO layer was reactive ion etched (RIE) to form sidewall spacers. FIGS. 1 and 2, with the exception of the source/drain regions, are similar to the structures obtained Next, the 250 Angstrom source/drain screen implantation silicon oxide was grown for 22 minutes at 830° C. in steam. Following this oxidation step, variations on the source/drain structure were performed.

The conventional abrupt junction was formed by a 5E15 atoms/cm$^2$ at 70 keV arsenic ion implant. The DDD structure was formed by an ion implantation matrix of arsenic, phosphorus and germanium. Half of the wafers received a 5E15 atoms/cm$^2$ at 125 keV germanium implant, and the control sample received the 5E15 atoms/cm$^2$ arsenic implant only. Phosphorus was implanted at 45 keV for doses of 2.5E15, 5E15, and 1E16 atoms/cm$^2$. Several wafers then received a 30 minute at 900° C. anneal in nitrogen. After the source/drain formation, a 1 hour anneal at 650° C. was used to anneal out the damage sites in the source/drain regions. The rest of the process is conventional, including a 7500 Angstrom borophosphosilicate glass (BPSG)/LTO deposition followed by a 15 minutes at 900° C. LTO anneal. Contacts were formed and aluminum patterned and etched. The aluminum anneal was performed in forming gas for 30 minutes at 390° C.

The test wafers used for SRP analysis consisted of blanket implant dose combinations of arsenic, phosphorus and germanium through a 250 Angstrom oxide screen. The samples then received the 1 hour at 650° C. fluorine anneal which was followed by a 6000 Angstrom undoped LTO deposition. The samples were annealed for 15 minutes at 900° C. in nitrogen to simulate a submicron process flow.

Figure 3:
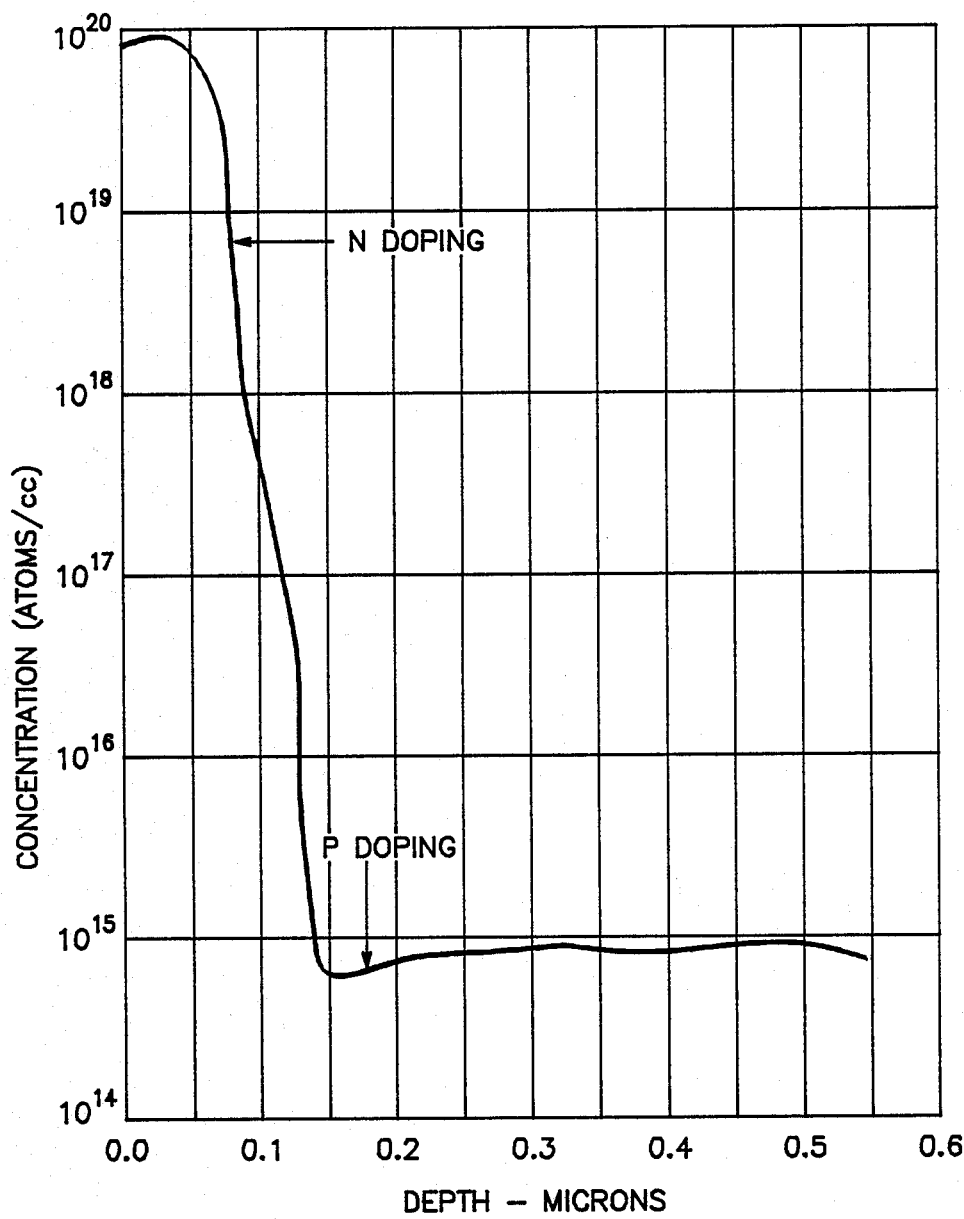
FIG. 3 is a spreading resistance profile (SRP) of arsenic concentration with depth for an arsenic dose of $5 \times 10^{15}$ (5E15) atoms/cm$^3$ at 70 keV, in accordance with a conventional source/drain structure.
Figure 4:
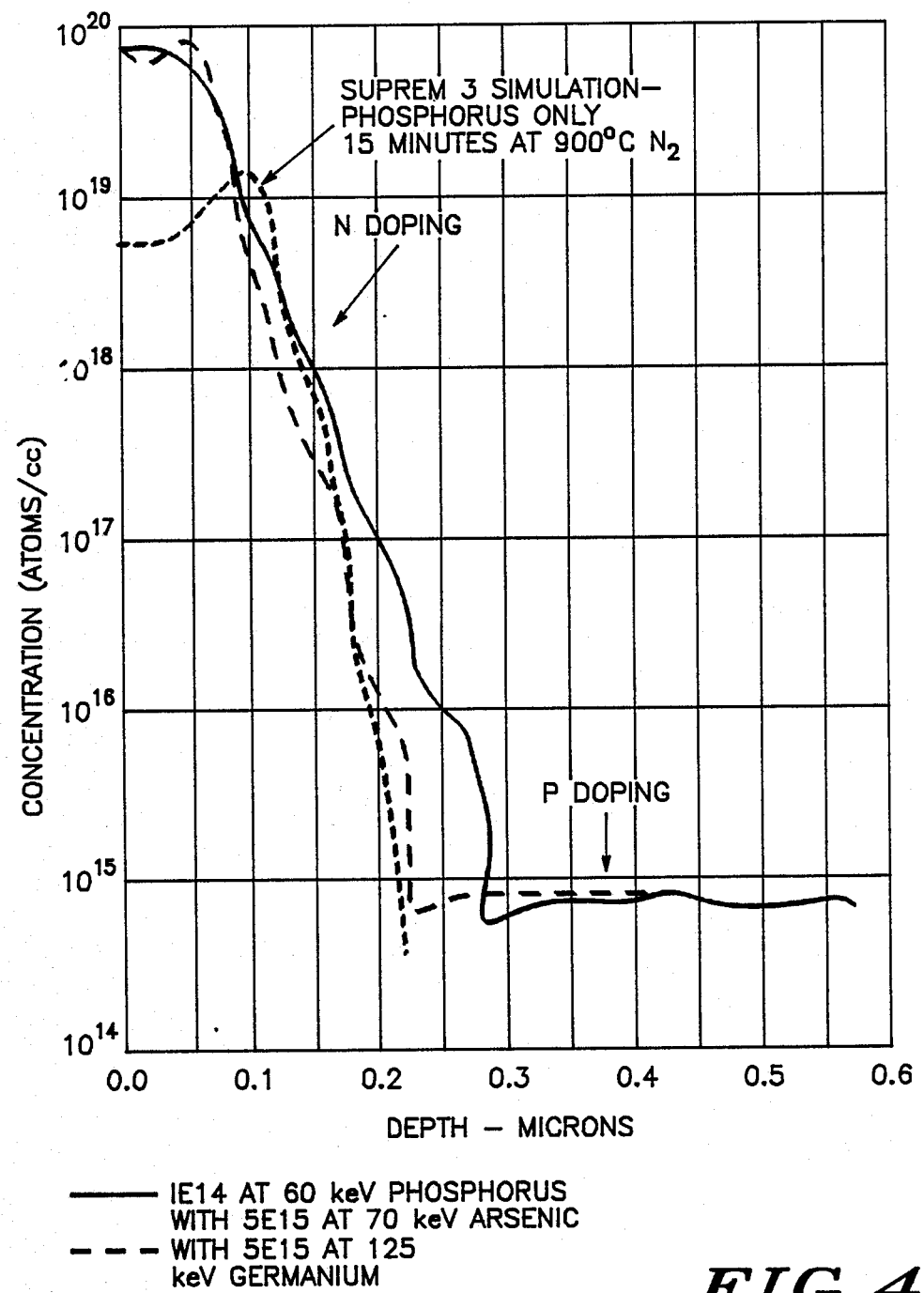
FIGS. 4 through 8 are SRPs of phosphorus and arsenic or high phosphorus alone concentrations with depth into the silicon substrate for particular doses, with and without a 5E15 atoms/cm$^2$ at 125 keV germanium dose.
Figure 5:
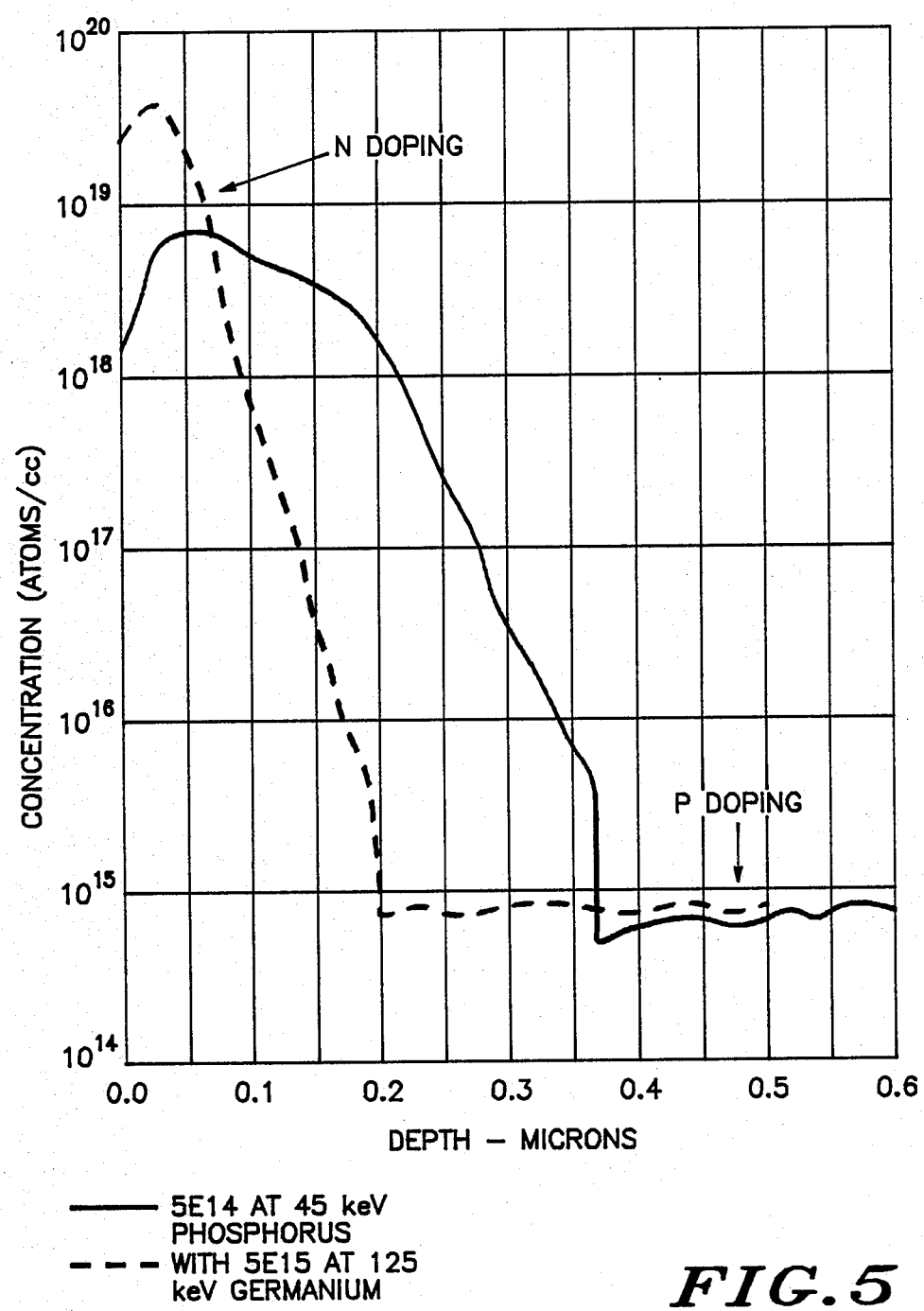
Figure 6:
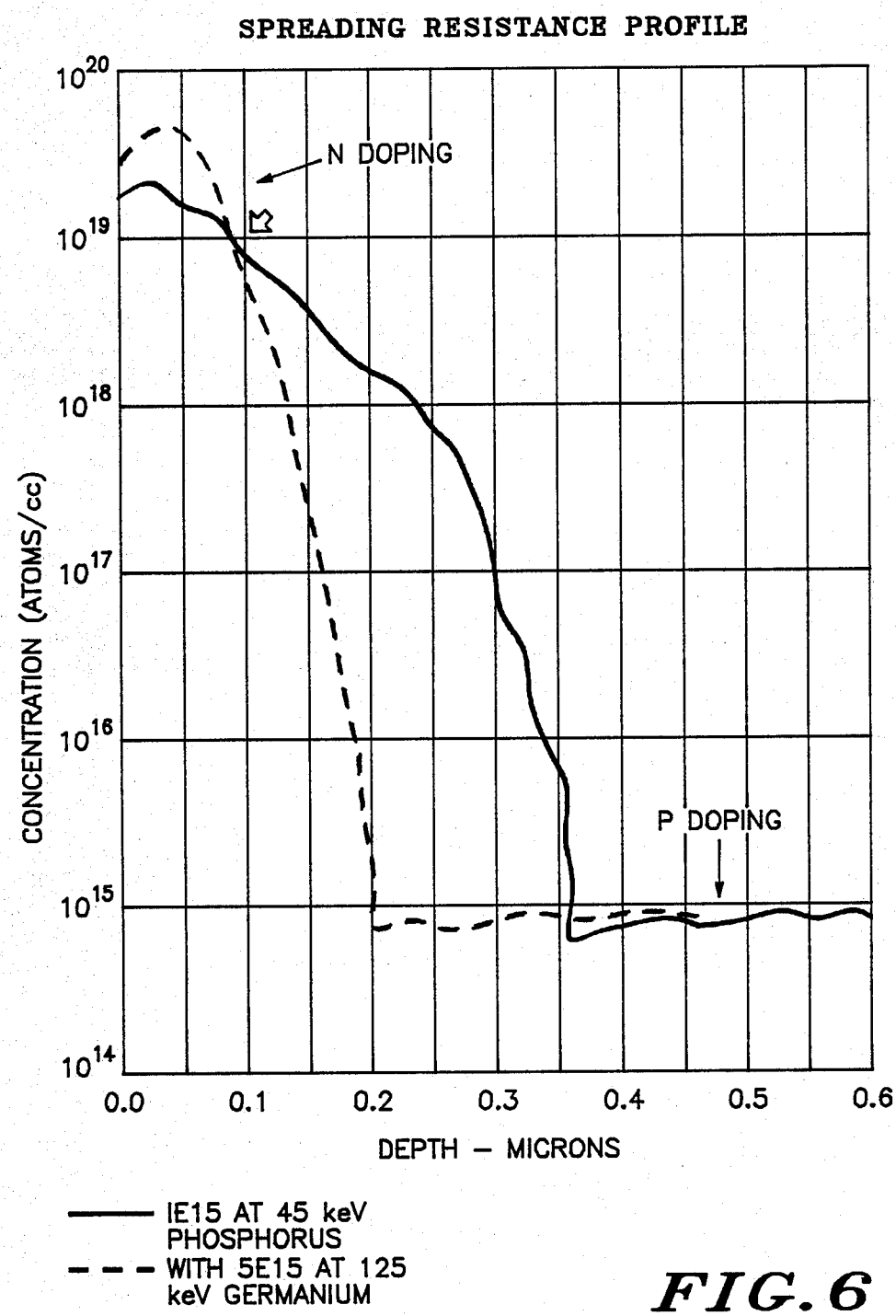
Figure 7:
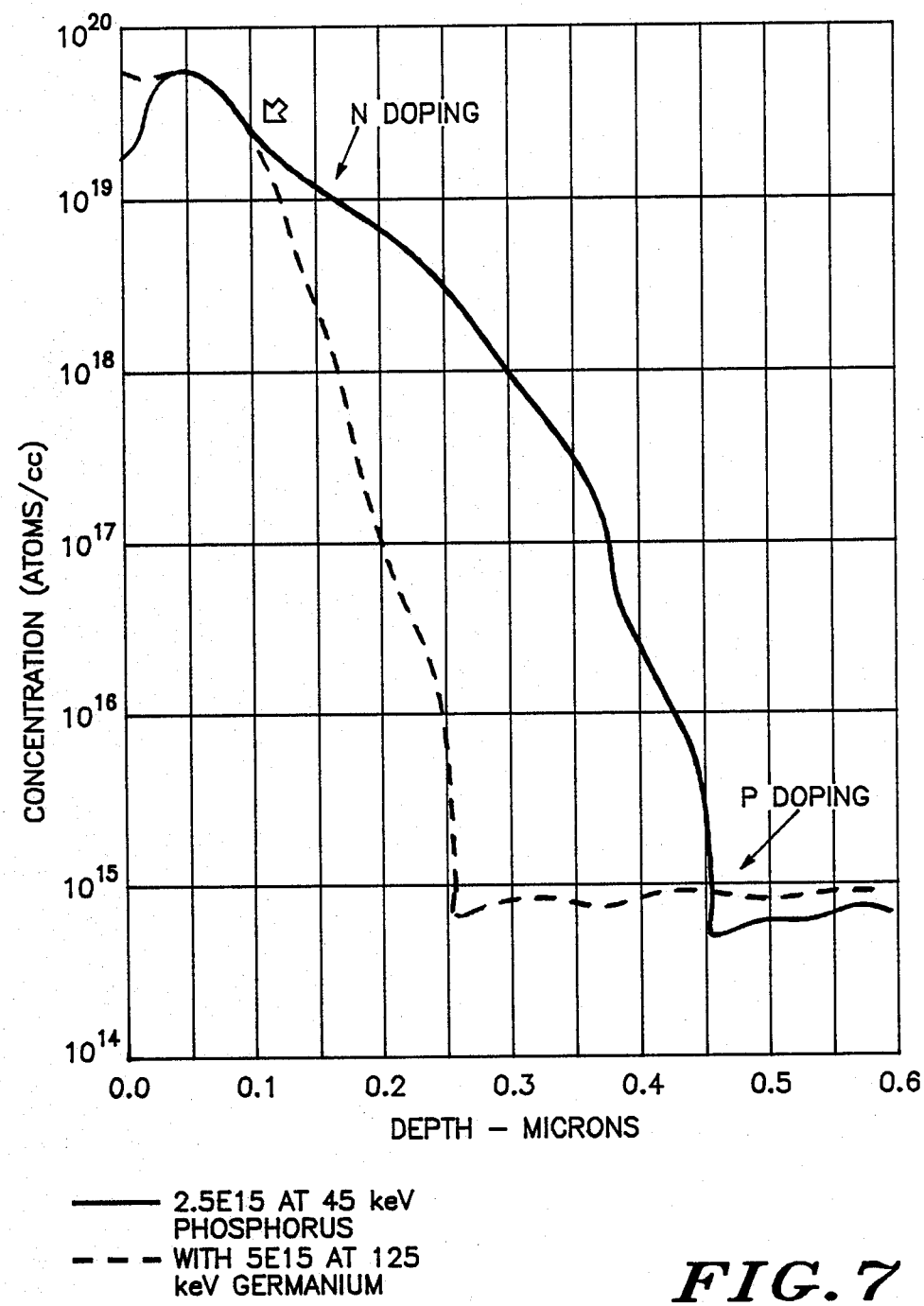
Figure 8:
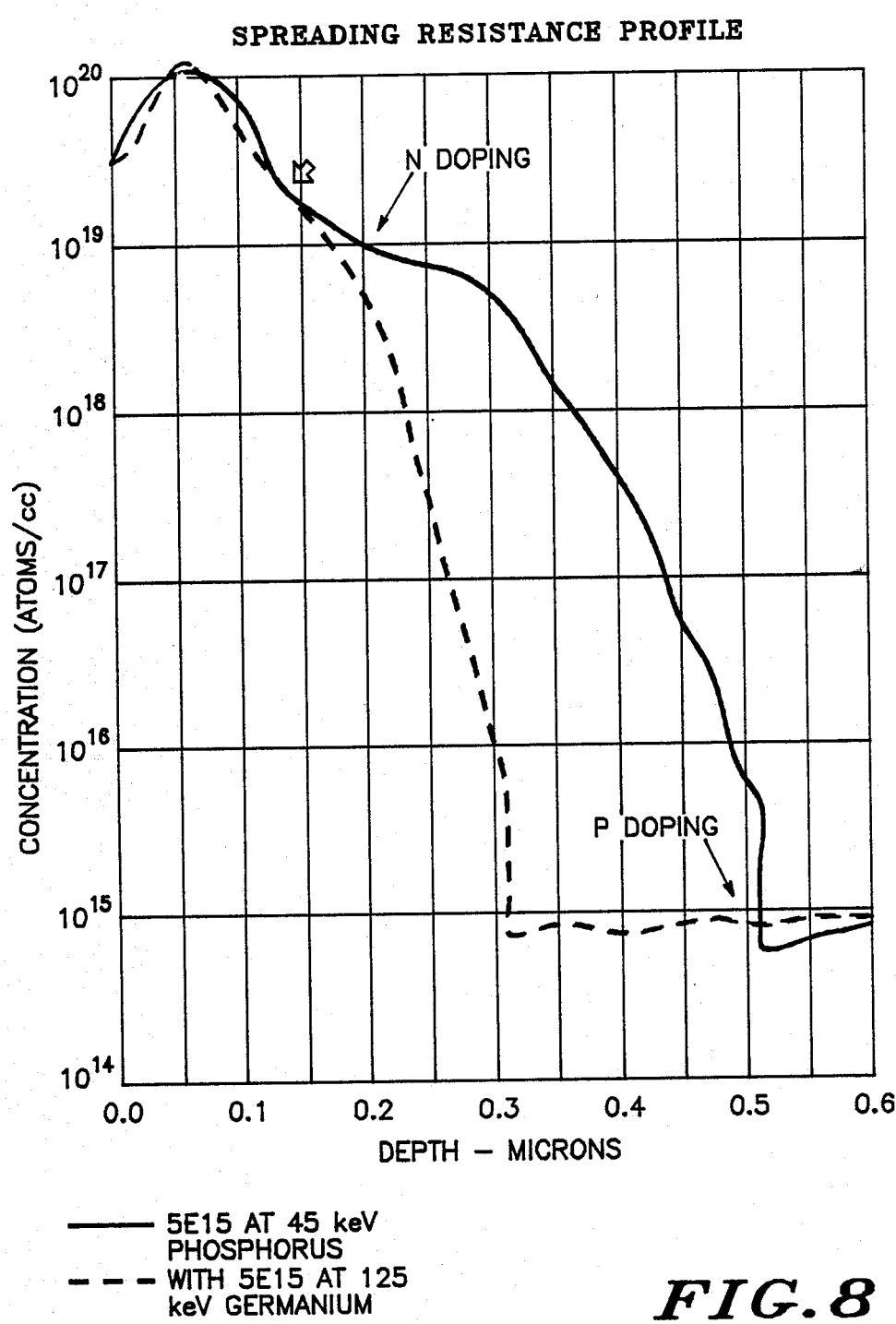

FIGS. 3 through 8 represent the SRPs for various arsenic, phosphorus and germanium implant combinations. FIG. 3 shows the control sample which only received the 5E15 atoms/cm$^2$ at 70 keV arsenic implant dose. The vertical junction depth is approximately 0.13 microns (um) measured at $N_b$=1E16 atoms/cm$^3$. FIG. 4 shows the concentration profiles for the double-diffused drain using a 5E15 atoms/cm$^2$ arsenic dose and a 1E14 atoms/cm$^2$ at 60 keV phosphorus n$^-$ dose with and without the 5E15 atoms/cm$^2$ at 125 keV germanium implant. It should be noted that the germanium implantation results in a shallower junction depth by approximately 400 Angstroms for the DDD structure.

FIGS. 5 through 8 show the effect of using a germanium implantation region overlapping the phosphorus implantation region in the MOS source/drain, for phosphorus doses ranging from 5E14 to 5E15 atoms/cm$^2$. Note that the vertical junction depth can be as deep as 0.35 um for a 5E14 atoms/cm$^2$ phosphorus dose which receives a 15 minute at 900° C. anneal. It should also be noted that the use of a germanium implantation step significantly reduces the vertical junction depth by as much as 0.16 um. Similar results are observed for the higher phosphorus implant doses. The SRP results clearly show a reduction in the vertical junction depth for the phosphorus source/drains when germanium implantation is used. It was surprisingly found that the germanium eliminated the transition region, also called the "kink" of the profile, for the phosphorus-only profiles shown at the arrow in FIGS. 6 through 8. This indicates that the germanium may annihilate point defects which cause the phosphorus n$^-$ region to become deeper in the presence of an As n$^+$ region. See, for example, R. B. Fair, "Concentration Profiles of Diffused Dopants in Silicon," Chapter 7, in F. F. Wang, Ed., *Impurity Doping Processes in Silicon*, North-Holland, New York, 1987, Although SRP can be used to quantify the vertical concentration profile, the lateral concentration profile can only be inferred by indirect methods by characterizing submicron n-channel MOS device behavior such as threshold voltage, peak substrate current, and $dV_t/dV_{ds}$ as a function of electrical channel length.

Figure 9:
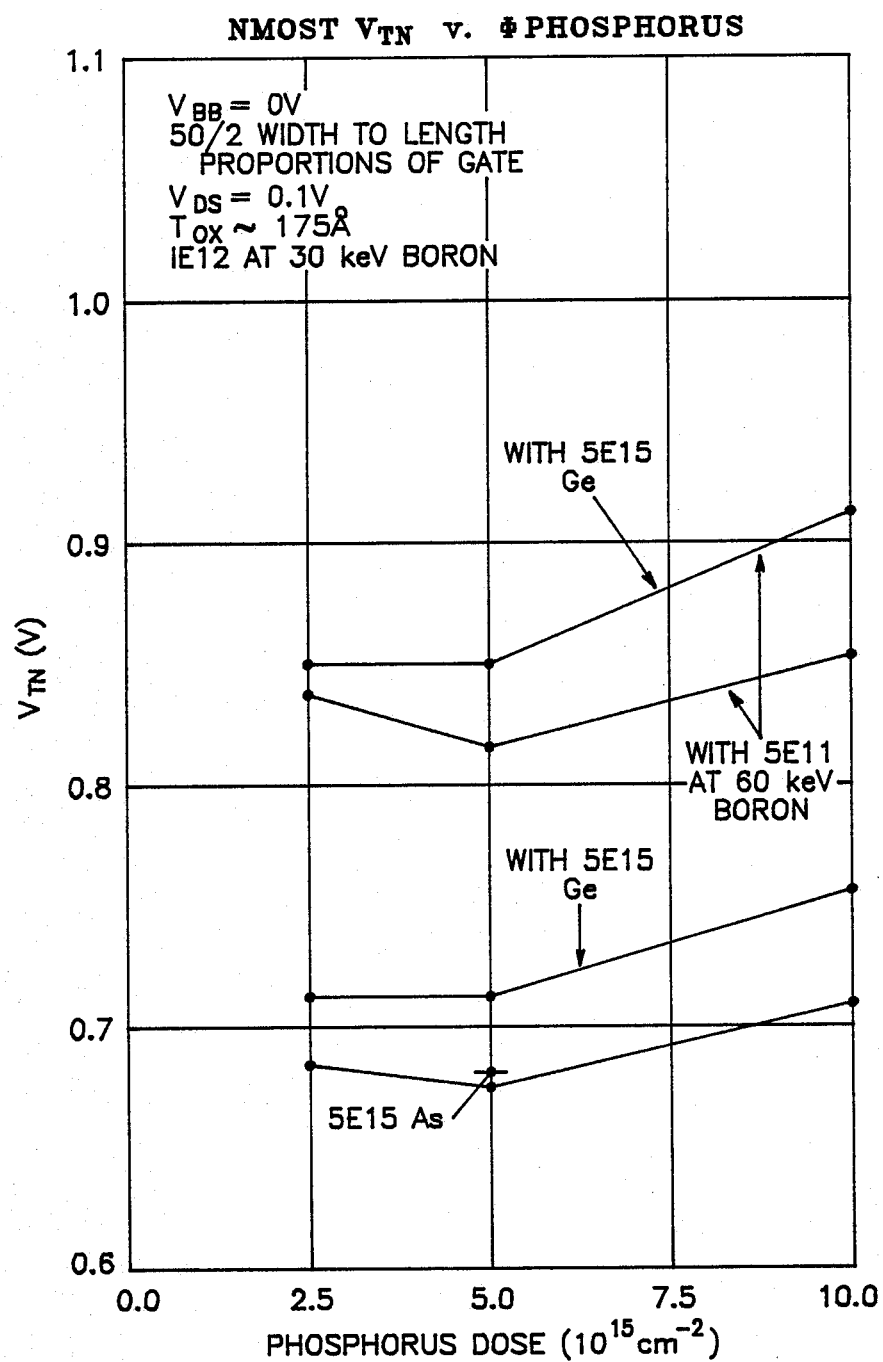
FIG. 9 is a plot of the threshold voltage, $V_{TN}$, v. phosphorus dose, $\phi p$, for particular n-channel MOS transistors.

FIG. 9 plots the 50/2 (width to length proportions of the gate) NMOS threshold voltage as a function of phosphorus source/drain implant dose. Since undoped poly was used to form the polysilicon gates, the source/drain implantation is used to doped the poly to n$^+$, and to set the work function. Samples with germanium consistently show an increase of 20 to 50 mV difference in the threshold voltage, expected to be due to differences in the electrical concentration of phosphorus at the poly/oxide interface. As a reference, the 5E15 atoms/cm$^2$ at 70 keV arsenic source/drain implant dose results in a similar long-channel NMOS threshold voltage compared to the 5E15 atoms/cm$^2$ at 45 keV phosphorus implant.

Figure 10:
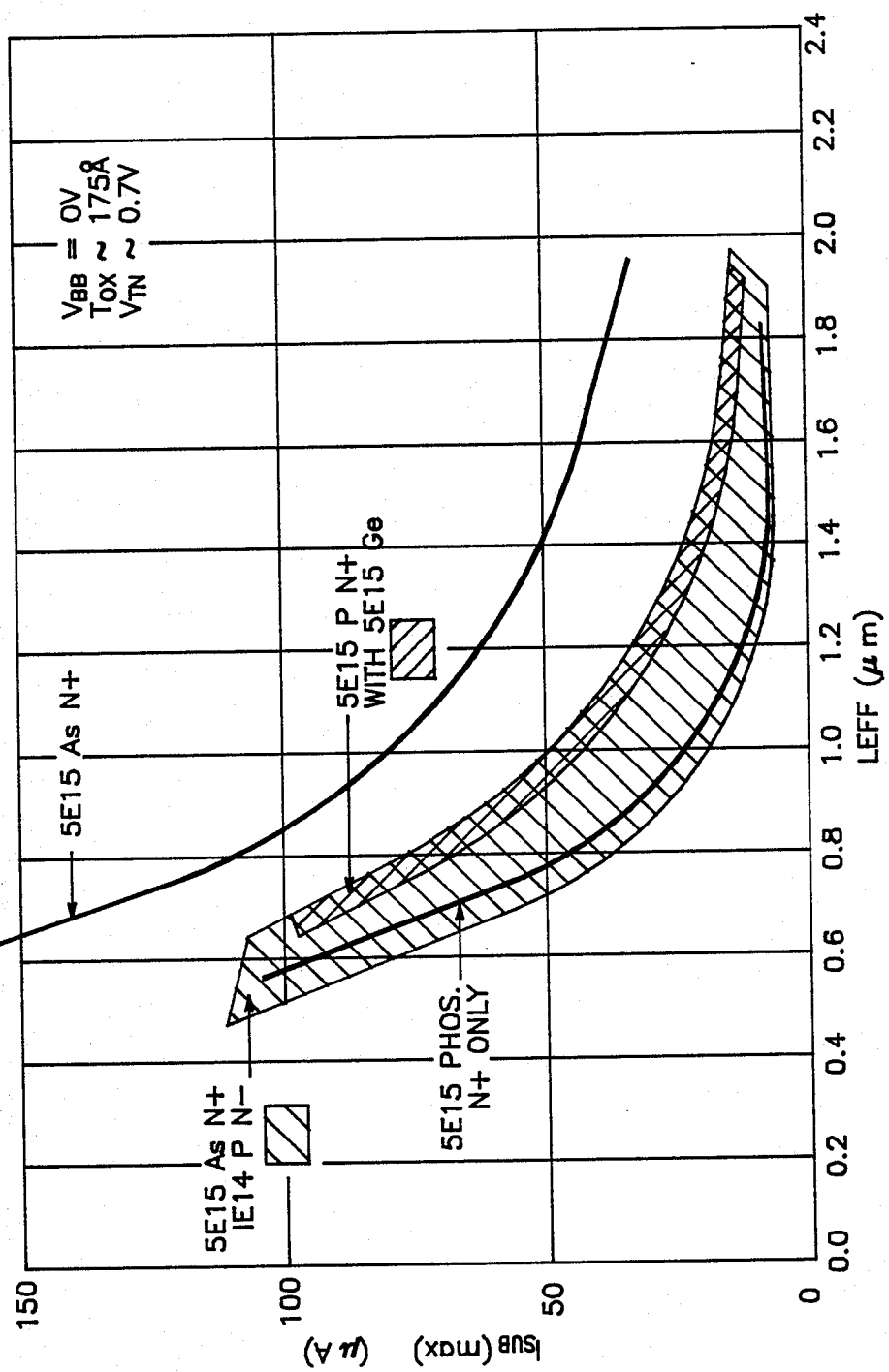
FIG. 10 is a plot of the maximum substrate current, $I_{sub}$ v. effective channel length, $L_{eff}$, for particular doping combinations for n-channel MOS transistors.

The peak substrate current is plotted as a function of electrical channel length in FIG. 10 for various source/drain structures. The 5E15 arsenic implantation results in the highest values; the 5E15 phosphorus implantation results in the lowest values. The upper and lower bounds for the peak substrate current curves is a result of the physical asymmetry in the source and drain structures. It was surprisingly found that the differences in the forward and reverse mode substrate currents was smaller for the device which received the 5E15 atoms/cm$^2$ phosphorus and 5E15 atoms/cm$^2$ germanium implantation as compared to the 5E15 atoms/cm$^2$ arsenic and 1E14 atoms/cm$^2$ phosphorus sample. Thus, an improvement in the asymmetrical nature of the graded drain occurs with the use of germanium implantation. Although an exact comparison between the phosphorus/arsenic and phosphorus/germanium implanted samples for the absolute values of peak substrate current is not possible due to the differences in n⁻ concentrations and device threshold voltage, FIG. 10 indicates that similar values for peak substrate current result with the use of germanium for high phosphorus implant doses.

Shown in FIG. 11 is a plot of the threshold voltage sensitivity to drain bias, $dV_t/dV_{ds}$, as a function of electrical channel length for the source/drain structures characterized in FIG. 10. Since the 5E15 atoms/cm² arsenic junction is the shallowest, it corresponds to the best case curve with the lowest $dV_t/dV_{ds}$. On the other hand, the 5E15 atoms/cm² phosphorus only sample shows the highest values since its junction depth is the deepest. It should be noted that the 5E15 atoms/cm² phosphorus with germanium sample results in very similar values compared to the standard DDD structure with arsenic and phosphorus.

Using well-known analytical techniques, the 5E15 atoms/cm² phosphorus source/drain structure resulted in a $\Delta L$ of 0.23 um, series resistance $R_s = 24.4$ ohm, and vertical mobility reduction term $\theta = 0.049$ V⁻¹. The 5E15 atoms/cm² phosphorus with germanium structure resulted in values of $\Delta L = 0.18$ um, $R_s = 28.8$ ohm and $\theta = 0.049$ V⁻¹. In comparison, the sheet resistance measured from the SRP analysis showed a similar ratio to the series resistance values for the samples with and without germanium. The $\Delta L$ values indicate that the lateral diffusion of the phosphorus junction may be only a bit smaller when germanium is used prior to the phosphorus implantation. This is also consistent with the $dV_t/dV_{ds}$ measurements since they become sensitive to the source/drain junction depth. Thus, this data suggests the germanium is retarding the lateral diffusion of phosphorus, but that the retardation is less than that which would be expected given the retardation of phosphorus diffusion in the vertical direction.

In summary, the use of germanium implantation in the presence of the phosphorus source/drain implant by close proximity or overlap of the germanium and phosphorus regions may result in acceptable graded junction profiles which have a shallow vertical junction depth with satisfactory lateral junction depths, similar to that which is schematically illustrated in FIG. 1. It is also anticipated that the structure of the invention will work as predicted with or without arsenic, although the improvement is more visible with arsenic since the arsenic seems to promote the phosphorus diffusion. While the order of the germanium and n-dopant introduction is not critical, it is recommended that germanium be implanted first for some applications. Although the LDD structure is still considered superior in terms of substrate current reduction and improvements in $BV_{dss}$ since the n+ and n⁻ implants are aligned by a horizontal offset, the phosphorus and germanium graded junction is considerably simpler to fabricate. Since the germanium implantation step may be required for the p-channel source/drain structures in CMOS for reasons not discussed here, the use of a single n-type phosphorus implantation aligned only to the sidewall spacer edge may result in a graded drain or GSD structure similar to that of a conventional DDD without the requirement for an additional phosphorus n⁻ implantation step. An additional unexpected advantage results from a more symmetric source and drain structure with similar forward and reverse mode substrate current values when germanium implantation is used. That is, the devices formed with germanium are more symmetric in their behavior when used.

However, it should also be noted that phosphorus and germanium may be beneficially employed in a LDD structure, where both phosphorus and germanium are used in the n+ region and phosphorus is present in the n⁻ region with or without germanium.

Another embodiment of the present invention is the use of selective germanium implantation using a resist mask to provide shallow n+ junctions where the germanium is present and relatively deep n+ junctions where the germanium is not present. For example, the selected deep n+ junctions would be used in bootstrap circuits since the lateral diffusion of the source/drain would be greater, and thus provide additional overlap (Miller) capacitance, while other of the devices in the circuit would have germanium and thus shallower source/drain regions. The polysilicon gate length could be adjusted accordingly since typical devices could have longer gate lengths. Also, it may be useful to have a deep source/drain region without germanium and a shallow n+ source/drain region with germanium on the same MOSFET, such as in SRAM sense amplifiers.

It should be noted that the present invention concerns using germanium and phosphorus n⁻ implantations steps aligned to the polysilicon gate edge and where the arsenic is either (1) not present, (2) aligned to a sidewall spacer on the polysilicon gate (the LDD structure) and (3) aligned to the polysilicon gate itself (the DDD structure). The invention should not be limited to any particular structure.

In another embodiment of the present invention, germanium together with arsenic may form shallow n+/n⁻ source/drain junctions for an LDD NMOS transistor, where phosphorus may be used for the n⁻ region. The unique process sequence would begin after the patterning of the gate. With only the gate in place, a phosphorus n⁻ implant is performed, the phosphorus being aligned to the polysilicon gate edge. Next, a sidewall spacer would be formed around the polysilicon gate using the conventional techniques, e.g. blanket formation of a conformal material such as oxide, polysilicon, nitride, metal, etc. and a subsequent anisotropic etch. Then, the arsenic n+ and germanium implants would be performed aligned to the sidewall spacer edge, thereby laterally spacing the n⁻ and n+ portions of the source/drains in the conventional LDD fashion. The order of the arsenic and germanium implantations is not critical and thus could be done in any order, for example, when removable sidewall spacers permit the n+ implantations to be done before the n⁻ implantations. Part of the invention is this embodiment would be that the germanium present would annihilate the point defects created by the arsenic n+ region, and provides shallow phosphorus n⁻ regions under the spacer region.

Further, the n⁻ regions of an LDD structure may also be formed by the introduction of both phosphorus and germanium into the same region, with only arsenic being used for the n+ region. Since arsenic is relatively slow diffusing under all conditions, the germanium is not required to overlap the arsenic or be adjacent thereto to the extent it needs to be on or adjacent to the phosphorus.

I claim:

1. A process for providing a doped n-type region in a semiconductor substrate, comprising the steps of:

providing a semiconductor substrate having a surface;

introducing germanium atoms into a first region of the semiconductor substrate, and introducing phosphorus into a second region of the semiconductor substrate, where said first region and said second region are in a relationship of overlapping but not coextensive; and annealing the semiconductor substrate.

2. The process of claim 1 wherein the germanium and phosphorus introductions are conducted by ion implantation.

3. The process of claim 2 wherein the only species used for the germanium introduction is Ge.

4. A process for providing a doped n-type region in a semiconductor substrate as a source/drain region for an n-channel MOSFET, comprising the steps of:

providing a semiconductor substrate having a surface;

providing a thin dielectric layer on the surface of the semiconductor substrate;

providing a patterned gate of conductive material on the thin dielectric layer, where the gate has opposite sides;

introducing germanium atoms into a first region of the semiconductor substrate on at least one side of the gate, and introducing phosphorus atoms into a second region of the semiconductor substrate, where said first region and said second region are in a relationship of overlapping but not coextensive; and annealing the semiconductor substrate to form source/drain regions in the semiconductor substrate beneath the opposite sides of the gate defining a channel in the semiconductor substrate between the two source/drain regions.

5. The process of claim 4 wherein the germanium and phosphorus introductions are conducted by ion implantation.

6. The process of claim 5 wherein the only species used for the germanium introduction is Ge.

7. A process for forming a source/drain region for an n-channel transistor on a semiconductor integrated circuit comprising the steps of:

providing a semiconductor substrate;

providing a thin dielectric layer on the substrate;

providing a patterned gate on the thin dielectric layer where the gate has opposite sides;

implanting phosphorus in a region of the semiconductor substrate aligned to at least one of the opposite sides of the gate;

providing a sidewall spacer around the patterned gate;

implanting germanium and arsenic into the semiconductor into the semiconductor substrate aligned with the sidewall spacer; and annealing the substrate to form source/drain regions in the semiconductor substrate on either side of the gate, the source/drain regions defining a channel in the substrate between them.

8. The process of claim 1 wherein the channel in the substrate has a length of one micron or less.

9. The process of claim 7 wherein the species implanted for the germanium ion implant is germanium only.

* * * * *